(12) United States Patent
Zhang

(10) Patent No.: US 11,925,924 B2
(45) Date of Patent: Mar. 12, 2024

(54) SYNTHETIC BLOCK FOR OPTIMIZING THE PERFORMANCE OF DIAMONDS AND GEMSTONES

(71) Applicant: GUILIN KEYSTONE MACHINERY CO., Ltd., Guilin (CN)

(72) Inventor: Xiaowen Zhang, Guilin (CN)

(73) Assignee: GUILIN KEYSTONE MACHINERY CO., Ltd., Guilin (CN)

( * ) Notice: Subject to any disclaimer, the term of this patent is extended or adjusted under 35 U.S.C. 154(b) by 452 days.

(21) Appl. No.: 16/758,937

(22) PCT Filed: Mar. 12, 2020

(86) PCT No.: PCT/CN2020/079032
§ 371 (c)(1),
(2) Date: Apr. 24, 2020

(87) PCT Pub. No.: WO2021/179260
PCT Pub. Date: Sep. 16, 2021

(65) Prior Publication Data
US 2022/0314179 A1 Oct. 6, 2022

(51) Int. Cl.
*B01J 3/04* (2006.01)
*B01J 3/00* (2006.01)

(52) U.S. Cl.
CPC .................. *B01J 3/048* (2013.01); *B01J 3/00* (2013.01); *Y10T 117/1096* (2015.01)

(58) Field of Classification Search
CPC ..... B01J 3/048; B01J 3/062; B01J 3/00; B01J 2203/0655; Y10T 117/1096
See application file for complete search history.

(56) References Cited

U.S. PATENT DOCUMENTS

| 2002/0081260 A1* | 6/2002 | Vagarali | B01J 3/06 423/446 |
| 2018/0207597 A1* | 7/2018 | Welch | B01J 3/06 |

FOREIGN PATENT DOCUMENTS

| CN | 205288332 U | * | 6/2016 |
| CN | 206343154 U | * | 7/2017 |
| CN | 10854850 A | * | 11/2018 |
| CN | 108854850 A | * | 11/2018 |

* cited by examiner

Primary Examiner — Hua Qi

(57) ABSTRACT

A synthetic block for optimizing the performance of diamonds and gemstones is provided, including: a sealing material, a thermal insulation material, conductive materials, and a heating material. The conductive materials are provided at both ends of the sealing material. The heating material abuts between the conductive materials, and a high-temperature and high-pressure area is formed inside the heating material. The thermal insulation material includes a first thermal insulation tube and a second thermal insulation tube that are sequentially telescoped the conductive materials. The first thermal insulation tube abuts on an outer wall of the heating material, the second thermal insulation tube is provided between the sealing material and the first thermal insulation tube, a height of the second thermal insulation tube is greater than that of the first thermal insulation tube, and the synthetic block is square.

6 Claims, 3 Drawing Sheets

SYNTHETIC BLOCK FOR OPTIMIZING THE PERFORMANCE OF DIAMONDS AND GEMSTONES

FIELD OF THE DISCLOSURE

The present disclosure relates to the technical field of superhard material synthesis, in particular to a synthetic block for optimizing the performance of diamonds and gemstones.

BACKGROUND OF THE DISCLOSURE

Diamonds have excellent physical and chemical properties. The diamond with complete crystal form and high purity has extremely high strength and high thermal stability, and is suitable for sawing tools with high impact and large load. Synthetic diamonds are a synthetic rod composed of high-purity graphite material and metal alloy catalyst, and prepared under high temperature and high pressure. The preparation of high-quality synthetic diamond requires a highly stable pressure and temperature, and any fluctuation will affect the growth of diamond crystals.

At present, the pressure and temperature of synthetic blocks commonly used in the market are within 5.5 GPa and 1500° C. Moreover, the temperature and pressure fields in most synthesis chambers are not uniform and have poor stability. Especially, in the synthesis of large chambers, the real pressure in the center of the chamber is lower than at the edge of the chamber, resulting in a large difference in the quality in the central part of the synthetic chamber of the synthetic diamond in actual production, and the physical properties such as the color and clarity of diamonds and gemstones cannot meet the requirements.

Therefore, it is necessary to provide a synthetic chamber capable of withstanding ultra-high pressure and ultra-high temperature, thereby optimizing the performance of diamonds and gemstones.

SUMMARY OF THE DISCLOSURE

In view of the shortcomings of the existing technology, the purpose of the present disclosure is to provide a synthetic block for optimizing the performance of diamonds and gemstones, which can withstand ultra-high pressure and ultra-high temperature, has good sealing and thermal insulation property, and achieves the purpose of optimizing the performance of diamonds and gemstones.

The above technical objectives of the present disclosure are achieved by the following technical solutions. A synthetic block for optimizing the performance of diamonds and gemstones is provided, including: a sealing member, a thermal insulator, two conductors and a heating material. The conductive materials are provided at both ends of the sealing member, the heater abuts between the two conductors, and a high temperature and high pressure area is formed inside the heater. The thermal insulator includes a first thermal insulation tube and a second thermal insulation tube that are sequentially telescoped the two conductors, the first thermal insulation tube abuts on an outer wall of the heater, the second thermal insulation tube is provided between the sealing, and the first thermal insulation tube, and a height of the second thermal insulation tube is larger than a height of the first thermal insulation tube. The synthetic block is square.

In a preferred embodiment, the heater includes: first heating sheets provided on surfaces of the two conductors, and heating tube connected between the first heating sheets.

In a preferred embodiment, the heater further includes a second heating sheet provided in the center of the high temperature and high pressure area, and both ends of the second heating sheet are connected to the heating tube.

In a preferred embodiment, third thermal insulation layers are respectively provided at both ends of the high temperature and high pressure area adjacent to the two conductors.

In a preferred embodiment, the heater includes: the first heating sheets provided on surfaces of the two conductors, a heating frame provided between the first heating sheets, and heating connectors connected to the first heating sheets and the heating frame.

In a preferred embodiment, a fourth thermal insulation layer is provided on a circumferential side of the high temperature and high pressure area adjacent to the heating frame.

In a preferred embodiment, the sealing member is a processed block of raw ore pyrophyllite from South Africa, or a compacted block of high-quality pyrophyllite powder from China.

In a preferred embodiment, the thermal insulator is made of a high-purity ceramic material.

In summary, the present disclosure has the following beneficial effects.

Compared with the single-layer thermal insulation structure used in traditional synthetic blocks, a synthetic block for optimizing the performance of diamonds and gemstones of the present disclosure employs a double thermal insulator composed of a first thermal insulation tube and a second thermal insulation tube to provide a comparative good pressure transmission performance and the thermal insulation performance can also be greatly improved, and the synthetic block can withstand extremely high pressure and high temperature within a certain period of time to optimize the physical properties such as color and clarity of diamonds and gemstones. In addition, a synthetic block for optimizing the performance of diamonds and gemstones of the present disclosure can prevent the sealing performance of the outer sealing member from dramatically dropping due to high temperature and high pressure phase change, thereby ensuring the production safety and structural stability and security.

Figure 1:
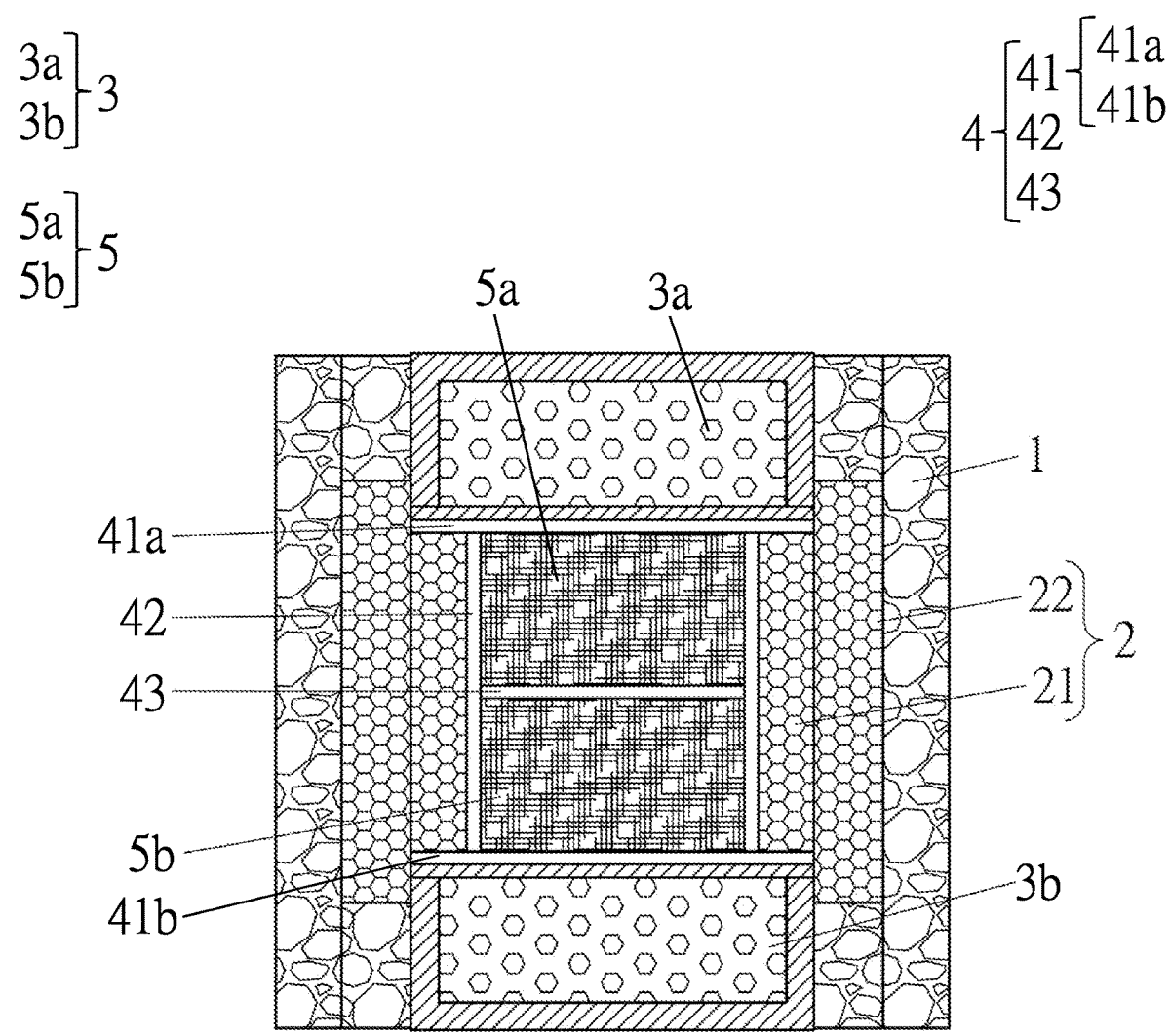
FIG. 1 is a schematic structural diagram of Embodiment 1 of the present disclosure.

DESCRIPTION OF REFERENCE NUMERALS:

1. sealing member; 2. thermal insulator; 3. two conductors; 4. heater; 5. high temperature and high pressure area; 21. first thermal insulation tube; 22. second thermal insulation tube; 41. first heating sheets; 42. heating tube; 43. second heating sheet; 23. third thermal insulation layers; 44. heating frame; 45. heating connectors; 24. fourth thermal insulation layer.

DETAILED DESCRIPTION OF THE EXEMPLARY EMBODIMENTS

The present disclosure will be described in further detail below with reference to the drawings.

The specific embodiment is only an explanation of the present disclosure, and it is not a limitation of the present disclosure. Those skilled in the art can make modifications without creative contribution to the embodiment after reading the specification, as long as they are in the right of the present disclosure within the scope of the requirements are protected by patent law.

Embodiment 1

As shown in FIG. 1, the present embodiment relates to a synthetic block for optimizing the performance of diamonds and gemstones, and the synthetic block includes: a sealing member 1, a thermal insulator 2, two conductors 3 (a first conductor 3a and a second conductor 3b), and a heater 4. The first conductor 3a is provided at one end of the sealing member 1 and the second conductor 3b is provided at another end of the sealing member 1, and the thermal insulator 2 is provided with a first thermal insulation tube 21 disposed between the first conductor 3a and the second conductor 3b, and a second thermal insulation tube 22 disposed between the first thermal insulation tube 21 and the sealing member 1. The second thermal insulation tube 22 is provided between the sealing member 1 and the first thermal insulation tube 21, a height of the second thermal insulation tube 22 is greater than a height of the first thermal insulation tube 21, and the synthetic block is square to achieve double sealing. The disclosed manner on the one hand increases the pressure transmission and thermal insulation of the synthetic block, and on the other hand increases the structural stability and safety of the synthetic block.

As shown in FIG. 1, in the present embodiment, the heater 4 includes: first heating sheets 41 provided with a first upper heating sheet 41a, a first lower heating sheet 41b, a heating tube 42 connected between the first heating sheets 41, in which an outer surface of the heating tube 42 is adjacent to an inner surface of the first thermal insulation tube 21, and a second heating sheet 43 provided in the center of the high temperature and high pressure area 5, in which both ends of the second heating sheet 43 are connected to the heating tube 42. The second heating sheet 43 is configured to separate the high temperature and high pressure area 5 into a first area 5a and a second area 5b. The first area 5a is defined by the first upper heating sheet 41a, the heating tube 42 and the second heating sheet 43. The second area 5b is defined by the first lower heating sheet 41b, the heating tube 42 and the second heating sheet 43. By virtue of the manner, the technical problem of insufficient pressure and temperature in the central part of the synthetic block is solved, so that a stable and uniform pressure field is formed in the high temperature and high pressure area 5, which is favor of improving the physical properties of diamonds and gemstones. The synthetic block has a simple structure and is easy to use, and the pressure field and temperature field of the high temperature and high pressure area 5 are uniform, so that the synthetic block of the present disclosure is with good stability and long synthesis time, and can efficiently optimize the color and clarity of diamonds and gemstones.

In the present embodiment, the described diamonds include, but are not limited to, natural diamonds, diamonds synthesized by high pressure and high temperature (HPHT), and diamonds produced by chemical vapor deposition (CVD). The described gemstones include, but are not limited to, sapphire, moissanite, ruby, beeswax amber, and emerald. The sealing member 1 is a processed block of raw ore pyrophyllite from South Africa, or a compacted block of high-quality pyrophyllite powder from China. Compared with the compacted block of pyrophyllite powder commonly used in China, the sealing member 1 has better pressure transmission performance and sealing performance, and is stable and reliable. The thermal insulator 2 is made of a high-purity ceramic material. The high-purity ceramics include, but are not limited to, magnesium oxide and aluminum oxide materials, which have good pressure transmission performance and can improve the thermal insulation performance, so that the synthetic block can withstand extremely high pressure and high temperature. In addition, a synthetic block for optimizing the performance of diamonds and gemstones of the present disclosure can prevent the sealing performance of the outer sealing member 1 from dramatically dropping due to high temperature and high pressure phase change, thereby ensuring the production safety. By using in combination with the six-face top hydraulic machine produced in China, the synthetic block can withstand the high pressure of 7-8 GPa and the high temperature of 2000-2500 degrees C., thereby optimizing the color and clarity of diamonds or gemstones within a certain period of time.

Embodiment 2

Figure 2:
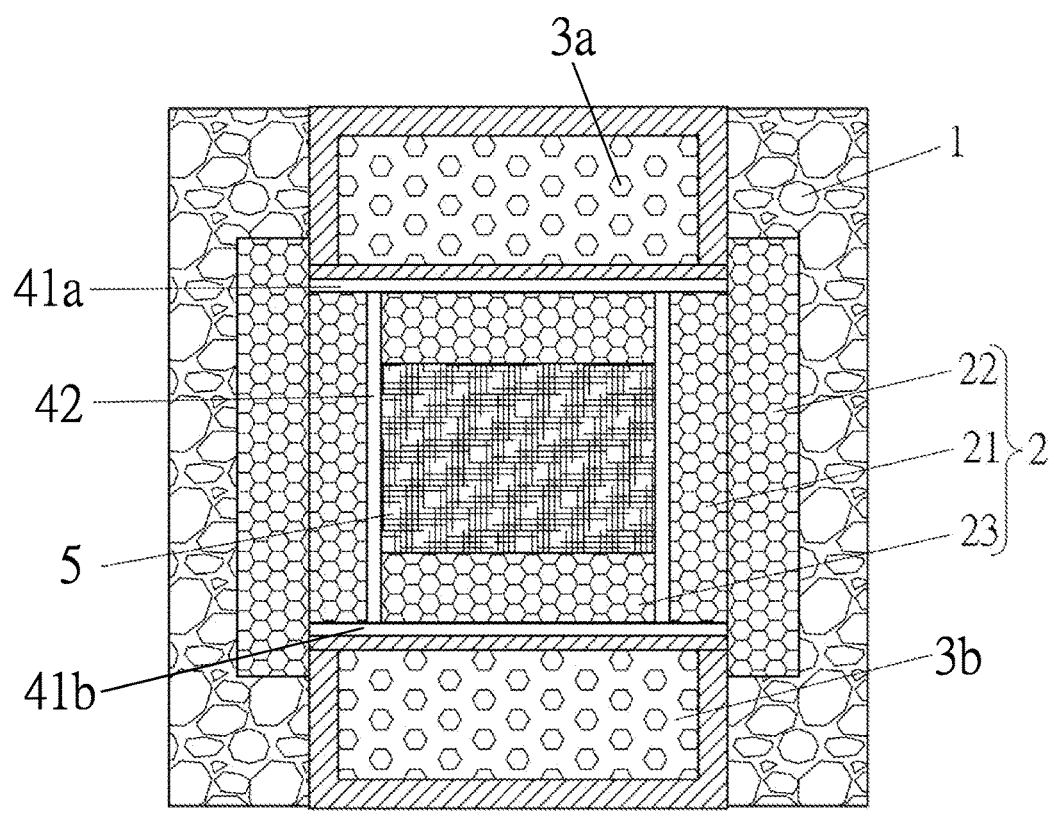
FIG. 2 is a schematic structural diagram of Embodiment 2 of the present disclosure.

As shown in FIG. 2, the present embodiment relates to a synthetic block for optimizing the performance of diamonds and gemstones, and the synthetic block includes: a sealing member 1, a thermal insulator 2, conductive materials 3, and a heater 4. The conductive materials 3 are provided at both ends of the sealing member 1, the heater 4 abuts between two conductors 3, and a high-temperature and high-pressure area 5 is formed inside the heater 4. The thermal insulator 2 includes a first thermal insulation tube 21 and a second thermal insulation tube 22 that are sequentially telescoped the two conductors 3. The first thermal insulation tube 21 abuts on an outer wall of the heater 4, the second thermal insulation tube 22 is provided between the sealing member 1 and the first thermal insulation tube 21, a height of the second thermal insulation tube 22 is greater than a height of the first thermal insulation tube 21, and the synthetic block is square to achieve double sealing. The disclosed manner on the one hand increases the pressure transmission and thermal insulation of the synthetic block, and on the other hand increases the structural stability of the synthetic block.

The difference between the present embodiment and the first embodiment is that, as shown in FIG. 2, in the present embodiment, the heater 4 includes: first heating sheets 41 provided with a first upper heating sheet 41a, a first lower heating sheet 41b, and heating tubes tube 42 connected between the first heating sheets 41. Third thermal insulation layer 23 are respectively provided at both ends of the high-temperature and high-pressure area 5 adjacent to the two conductors 3, so that the thermal insulation performance of the high-temperature and high-pressure area 5 is further improved. By using in combination with the six-face top hydraulic machine produced in China, the synthetic block can withstand the high pressure of 7-8 GPa and the high temperature of 2000-2500 degrees Celsius, thereby optimizing the color and clarity of diamonds or gemstones within a certain period of time.

Embodiment 3

Figure 3:
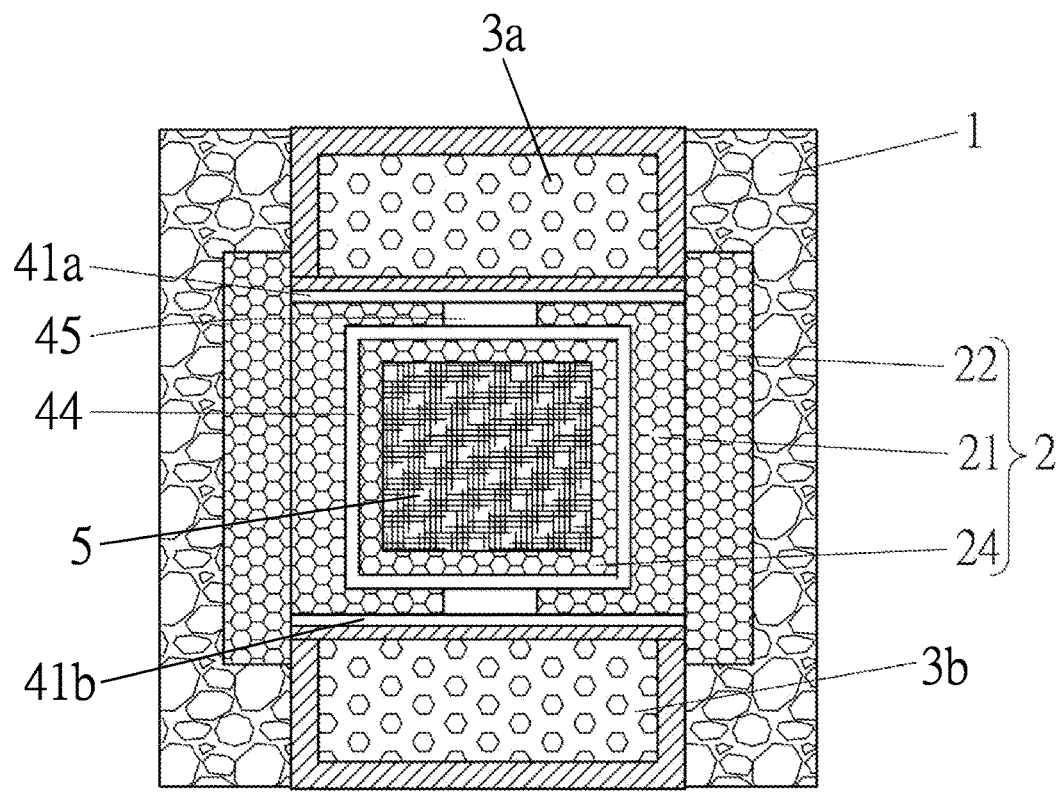
FIG. 3 is a schematic structural diagram of Embodiment 3 of the present disclosure.

As shown in FIG. 3, the present embodiment relates to a synthetic block for optimizing the performance of diamonds and gemstones, and the synthetic block includes: a sealing member, a thermal insulator, two conductors and a heater.

The two conductors 3 are provided at both ends of the sealing member 1, the heater 4 abuts between two conductors 3, and a high-temperature and high-pressure area 5 is formed inside the two conductors 4. The thermal insulator 2 includes a first thermal insulation tube 21 and a second thermal insulation tube 22 that are sequentially telescoped the two conductors 3. The first thermal insulation tube 21 abuts an outer wall of the heater 4, the second thermal insulation tube 22 is provided between the sealing member 1 and the first thermal insulation tube 21, a height of the second thermal insulation tube 22 is greater than a height of the first thermal insulation tube 21, and the synthetic block is square to achieve double sealing. The disclosed manner on the one hand increases the pressure transmission and thermal insulation of the synthetic block, and on the other hand increases the structural stability of the synthetic block.

The difference between the present embodiment and the first and second embodiments is that, as shown in FIG. 3, the heater 4 includes: first heating sheets 41 provided with a first upper heating sheet 41a, a first lower heating sheet 41b, a heating frame 44 provided between the first heating sheets 41, and heating connectors 45 connected to the first heating sheets 41 and the heating frame 44. A fourth thermal insulation layer 24 is provided on a circumferential side of the high temperature and high pressure area 5 adjacent to the heating frame 44. In addition, the first thermal insulation tube 21 is tightly assembled on the side of the heating frame 44, and the cross section of the first thermal insulation tube 21 is in a ⊏ shape to further improve the thermal insulation and structural stability of the high temperature and high pressure area 5. By using in combination with the six-face top hydraulic machine produced in China, the synthetic block can withstand the high pressure of 7-8 GPa and the high temperature of 2000-2500 degrees Celsius, thereby optimizing the color and clarity of diamonds or gemstones within a certain period of time.

The specific working process and principle of the present disclosure is as follows. Compared with the single-layer thermal insulation structure used in traditional synthetic blocks, a synthetic block for optimizing the performance of diamonds and gemstones of the present disclosure employs the double thermal insulator 2 composed of the first thermal insulation tube 21 and the second thermal insulation tube 22 to provide a comparative good pressure transmission performance and the thermal insulation performance can also be greatly improved, and the synthetic block can withstand extremely high pressure and high temperature within a certain period of time to optimize the physical properties such as color and clarity of diamonds and gemstones. In addition, a synthetic block for optimizing the performance of diamonds and gemstones of the present disclosure can prevent the sealing performance of the outer sealing member 1 from dramatically dropping due to high temperature and high pressure phase change, thereby ensuring the production safety and structural stability and security.

The above-mentioned descriptions represent merely an exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A synthetic block for optimizing performance of gemstones, comprising:

a sealing member (1), a thermal insulator (2), a first conductor (3a), a second conductor (3b), a heater (4) and a high temperature and high pressure area (5);

wherein the first conductor (3a) is provided at one end of the sealing member (1) and the second conductor (3b) is provided at another end of the sealing member (1), wherein the insulator (2) is provided with a first thermal insulation tube (21) disposed between the first conductor (3a) and the second conductor (3b), and a second thermal insulation tube (22) disposed between the first thermal insulation tube (21) and the sealing member (1), and a height of the second thermal insulation tube (22) is greater than a height of the first thermal insulation tube (21), wherein the high temperature and high pressure area (5) is formed inside the heater (4) and has a structure selected from any one of a center of the high temperature and high pressure area (5) passed through by a second heating sheet (43) and an integrated structure, wherein the heater (4) is provided with a first upper heating sheet (41a) and a first lower heating sheet (41b), when the center of the high temperature and high pressure area (5) is passed through by the second heating sheet (43), the heater (4) is further provided with a heating tube (42), the first upper heating sheet (41a) is disposed between the first conductor (3a) and the heating tube (42), and the first lower heating sheet (41b) is disposed between the second conductor (3b) and the heating tube (42), and one end of the heating tube (42) is connected to the first upper heating sheet (41a), another end of the heating tube (42) is connected to the first lower heating sheet (41b), and an outer surface of the heating tube (42) is adjacent to an inner surface of the first thermal insulation tube (21), and the second heating sheet (43) is arranged in parallel between the first upper heating sheet (41a) and the first lower heating sheet (41b), both ends of the second heating sheet (43) are connected to the heating tube (42), wherein a first area (5a) is defined by the first upper heating sheet (41a), the heating tube (42) and the second heating sheet (43), and a second area (5b) is defined by the first lower heating sheet (41b), the heating tube (42) and the second heating sheet (43), wherein one end of the first thermal insulation tube (21) is connected to the first upper heating sheet (41a), and another end of the first thermal insulation tube (21) is connected to the first lower heating sheet (41b), an outer surface of the second thermal insulation tube (22) is adjacent to the sealing member (1), and an inner surface of the second thermal insulation tube (22) is correspondingly adjacent to the first thermal insulation tube (21), a part of the first conductor (3a), and a part of the second conductor (3b).

2. The synthetic block for optimizing performance of gemstones according to claim 1, wherein third thermal insulation layers (23) are respectively provided at both ends of the high temperature and high pressure area (5) facing toward the first conductor (3a) and the second conductor (3b) respectively.

3. The synthetic block for optimizing performance of gemstones according to claim 1, wherein, when the high temperature and high pressure area (5) is the integrated structure, the heater (4) includes:

a heating frame (44) provided between the first upper heating sheet (41a) and the first lower heating sheet (41b); and two heating connectors (45), one of the two heating connectors (45) connected to the first upper heating sheet (41*a*) and the heating frame (44), another one of the two heating connectors (45) connected to the first lower heating sheet (41*b*) and the heating frame (44).

4. The synthetic block for optimizing performance of gemstones according to claim 3, wherein a fourth thermal insulation layer (24) is provided on a circumferential side of the high temperature and high pressure area (5) adjacent to the heating frame (44).

5. The synthetic block for optimizing performance of gemstones according to claim 1, wherein the sealing member (1) is a processed block of raw ore pyrophyllite from South Africa, or a compacted block of pyrophyllite powder from China.

6. The synthetic block for optimizing performance of gemstones according to claim 1, wherein the thermal insulator (2) is made of a ceramic material.

\* \* \* \* \*